US007470295B2

(12) United States Patent
Kim et al.

(10) Patent No.: US 7,470,295 B2
(45) Date of Patent: Dec. 30, 2008

(54) POLISHING SLURRY, METHOD OF PRODUCING SAME, AND METHOD OF POLISHING SUBSTRATE

(75) Inventors: Dae Hyung Kim, Gyeonggi-Do (KR); Seok Min Hong, Gyeonggi-Do (KR); Jae Hyun Jeon, Gyeonsangbuk-Do (KR); Ho Seong Kim, Gyeonggi-Do (KR); Hyun Soo Park, Gyeonggi-Do (KR); Un Gyu Paik, Seoul (KR); Jae Gun Park, Gyeonggi-Do (KR); Yong Kuk Kim, Seoul (KR)

(73) Assignees: K.C. Tech Co., Ltd., Anseong-si (KR); IUCF-HYU, Seoul (KR)

( * ) Notice: Subject to any disclaimer, the term of this patent is extended or adjusted under 35 U.S.C. 154(b) by 51 days.

(21) Appl. No.: 11/078,538

(22) Filed: Mar. 11, 2005

(65) Prior Publication Data

US 2005/0198912 A1    Sep. 15, 2005

(30) Foreign Application Priority Data

Mar. 12, 2004  (KR) ..................... 10-2004-0016943
May 4, 2004    (KR) ..................... 10-2004-0031279

(51) Int. Cl.
*C09G 1/00*   (2006.01)
*C09G 1/04*   (2006.01)
*C09G 1/02*   (2006.01)

(52) U.S. Cl. ............................. 51/307; 51/308; 51/309; 106/3

(58) Field of Classification Search ........... 51/307–309; 106/3; 438/690–694

See application file for complete search history.

(56) References Cited

U.S. PATENT DOCUMENTS 3,945,843 A    3/1976  Holty et al.
5,772,280 A    6/1998  Massara et al.

(Continued)

FOREIGN PATENT DOCUMENTS

EP    1020501    7/2000

(Continued)

OTHER PUBLICATIONS

English Translation of First Office Action corresponding to Chinese Patent Application No. 200480012926.7 dated Oct. 12, 2007.

*Primary Examiner*—Michael A Marcheschi
(74) *Attorney, Agent, or Firm*—Marger Johnson & McCollom PC

(57) ABSTRACT

Disclosed herein is a polishing slurry for chemical mechanical polishing. The polishing slurry comprises polishing particles, which have a particle size distribution including separated fine and large polishing particle peaks. The polishing slurry also comprises polishing particles, which have a median size of 50-150 nm. The present invention provides the slurry having an optimum polishing particle size, in which the polishing particle size is controlled and which is useful to produce semiconductors having fine design rules by changing the production conditions of the slurry. The present invention also provides the polishing slurry and a method of producing the same, in which a desirable CMP removal rate is assured and scratches are suppressed by controlling a polishing particle size distribution, and a method of polishing a substrate.

11 Claims, 8 Drawing Sheets

U.S. PATENT DOCUMENTS

| | | | |
|---|---|---|---|
| 5,772,780 A | 6/1998 | Homma et al. | |
| 6,043,155 A | 3/2000 | Homma et al. | |
| 6,221,118 B1 | 4/2001 | Yoshida et al. | |
| 6,299,659 B1 | 10/2001 | Kido et al. | |
| 6,343,976 B1 | 2/2002 | Yoshida et al. | |
| 6,365,520 B1* | 4/2002 | Rhoades et al. | 438/690 |
| 6,375,694 B1* | 4/2002 | Roberts et al. | 51/309 |
| 6,387,139 B1 | 5/2002 | Kido et al. | |
| 6,407,000 B1* | 6/2002 | Hudson | 438/693 |
| 6,410,444 B1 | 6/2002 | Kido et al. | |
| 6,420,269 B2 | 7/2002 | Matsuzawa et al. | |
| 6,436,835 B1 | 8/2002 | Kido et al. | |
| 6,440,187 B1 | 8/2002 | Kasai et al. | |
| 6,478,836 B1 | 11/2002 | Kido et al. | |
| 6,615,499 B1 | 9/2003 | Matsuzawa et al. | |
| 2003/0061766 A1* | 4/2003 | Vogt et al. | 51/308 |
| 2003/0104770 A1 | 6/2003 | Pasqualoni et al. | |
| 2005/0175525 A1* | 8/2005 | Fu et al. | 423/266 |
| 2005/0190246 A1* | 9/2005 | Klingman et al. | 347/101 |
| 2006/0216935 A1* | 9/2006 | Oswald et al. | 438/691 |

FOREIGN PATENT DOCUMENTS

| | | |
|---|---|---|
| EP | 1061111 | 12/2000 |
| EP | 1148538 | 10/2001 |
| JP | 2001-55559 | 2/2001 |
| JP | 2001323254 | 11/2001 |
| JP | 2001326199 | 11/2001 |
| JP | 2002319556 | 10/2002 |
| KR | 1020010108048 | 7/2001 |
| KR | 1020010089878 | 12/2001 |
| KR | 1020040019897 | 6/2004 |
| KR | 2004-0098671 | 11/2004 |
| KR | 10200498671 | 11/2004 |
| KR | 1020050091476 | 9/2005 |
| WO | 02/38338 | 5/2002 |
| WO | 02067309 | 8/2002 |
| WO | 02/081584 | 10/2002 |
| WO | 02083804 | 10/2002 |

* cited by examiner

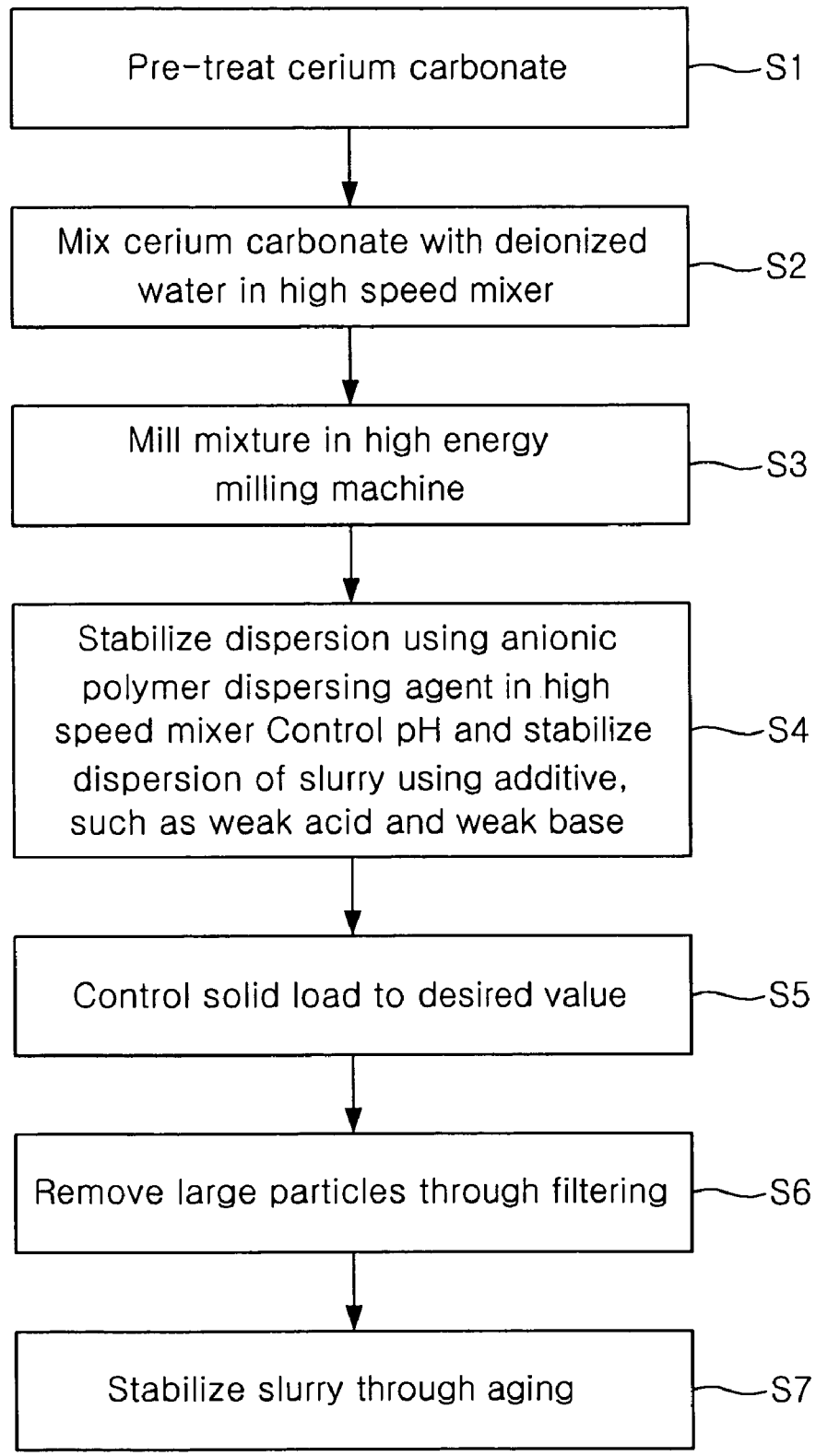

POLISHING SLURRY, METHOD OF PRODUCING SAME, AND METHOD OF POLISHING SUBSTRATE

BACKGROUND OF THE INVENTION

1. Field of the Invention

The present invention relates, in general, to a slurry for chemical mechanical polishing (hereinafter, referred to as 'CMP') and, more particularly, to a polishing slurry, a method of producing the same, and a method of polishing a substrate. The polishing slurry has high selectivity in terms of a polishing speed of an oxide layer to that of a nitride layer used in CMP of an STI (shallow trench isolation) process which is essential to produce ultra highly integrated semiconductors having a design rule of 256 mega D-RAM or more.

2. Description of the Related Art

CMP is a semiconductor processing technology in which a mechanical process using polishing particles between a pressed wafer and a polishing pad and chemical etching using a slurry are simultaneously conducted, and has been an essential process of global planarization technology in the production of submicron-scaled semiconductor chips since IBM Co., Ltd. in the USA developed it at the end of the 1980's.

A description will be given of a CMP process and a slurry needed for this process, with reference to FIGS. 1a to 1c. The CMP process, in which an uneven portion of a surface of a wafer is smoothed in a semiconductor process, is a process where, after the surface of the wafer is chemically transformed by an acidic or basic solution of the slurry to instantaneously form a layer weakly bonded to the surface, the layer thus formed is mechanically removed using particles in the slurry. In other words, the wafer is pressed while the slurry is provided to the surface of the wafer, thereby mechanically polishing the surface of the wafer using the particles in the slurry.

To conduct the CMP process, a head 3, on which a wafer 1 is to be mounted, a pad 4 rotating in the same direction as the head, and a slurry 2 provided between them, containing nano-sized polishing particles, are prepared. The wafer 1 is mounted on a wafer chuck 7 of the head 3 by surface tension or vacuum pressure. In the CMP process, the wafer 1 is polished by the pad 4 and the slurry 2. A polishing table 5, to which the pad 4 is attached, merely rotates, but the head 3 simultaneously rotates and reciprocates while deviating from the center of rotation of the polishing table 5. At the same time, the wafer 1 is pressed toward the polishing table 5 with a predetermined pressure. The surface of the wafer 1 comes into contact with the pad 4 due to the weight of the head and applied pressure, and the slurry flows into fine gaps in the interface, that is to say, the pores 8 of the pad. Mechanical polishing is achieved by polishing particles of the slurry and surface protrusions 9 of the pad 4, and chemical polishing is achieved by chemical components of the slurry. Furthermore, upper sides of projections of the wafer 1, in which devices are formed, first come into contact with the polishing particles or the surface protrusions, and pressure is concentrated on the projections of the wafer. Accordingly, the projections are removed at relatively high surface removal speed, resulting in uniform removal of the projections.

The types of slurry are roughly classified into a slurry for oxide, a slurry for metal, and a slurry for poly-silicon according to the type of object to be polished. The slurry for oxide is used to polish an interlayer insulating film and a silicon oxide ($SiO_2$) layer employed in an STI (shallow trench isolation) process, and roughly comprises polishing particles, deionized water, a pH stabilizer, and a surfactant. The polishing particles function to mechanically polish the surface of the object by means of pressure from a polishing machine, and are exemplified by silica ($SiO_2$), ceria ($CeO_2$), and alumina ($Al_2O_3$). Particularly, ceria slurry is frequently used to polish the silicon oxide layer during the STI process, and in this case, a silicon nitride layer is mainly used as a polishing stopper layer.

If polishing speed selectivity of the oxide layer to the nitride layer is low, generally, a dishing phenomenon, in which an excessive volume of the oxide layer is removed, occurs due to the loss of adjacent nitride layer patterns. Thus, it is impossible to achieve uniform surface flattening. Hence, an additive is added to the ceria slurry to reduce the removal speed of the nitride layer so as to improve the polishing speed selectivity of the oxide layer to the nitride layer. However, the use of the additive is disadvantageous in that the removal speed of the oxide layer, as well as the removal speed of the nitride layer, is reduced. Furthermore, the polishing particles of the ceria slurry are typically larger than those of the silica slurry, and therefore scratch the surface of the wafer.

Accordingly, the slurry for STI CMP requires high selectivity and polishing speed, dispersion and micro-scratch stabilities, and narrow and uniform particle size distribution. Additionally, the number of large particles having the size of 1 μm or more must exist within a predetermined range.

With respect to conventional technology of producing the slurry for STI CMP, U.S. Pat. Nos. 6,221,118 and 6,343,976, granted to Hitachi Inc., disclose a method of synthesizing ceria particles and a method of producing a slurry having high selectivity using the same.

These patents describe characteristics of particles required in the slurry for STI CMP, the type of additives containing polymer, and the production method using them in very critical and wide ranges. Particularly, the patents suggest wide ranges of an average grain size, an average primary particle size, and an average secondary particle size. In another conventional technology, U.S. Pat. No. 6,420,269, granted to Hitachi Inc., discloses a method of synthesizing various ceria particles and a method of producing a slurry having high selectivity using the same. Furthermore, in the prior arts, U.S. Pat. Nos. 6,436,835, 6,299,659, 6,478,836, 6,410,444, and 6,387,139, which have been made by Showa Denko Co. Ltd. in Japan, disclose a method of synthesizing ceria particles and a method of producing a slurry having high selectivity using the same. These patents mostly describe the types of additives added to the slurry, effects due to them, and a coupling agent.

However, the average particle size and the particle size distribution of the slurry particles suggested by conventional technologies are problematic in that, since the particles are large, if the slurry particles are used to produce semiconductors having fine design rules, many micro-scratches may be formed. With respect to this, if the large particles are removed through simple filtering in order to form a slurry having no scratches, consumption of filters increases and reproducibility is poor.

Additionally, conventional technologies disclose only the average particle size of polishing particles constituting the slurry and the distribution of the polishing particles, but not the effects of the specific size distribution of the slurry particles within the given average particle size range on the removal rate of STI CMP or on the creation of scratches. As well, they do not disclose other characteristics of the slurry produced under process conditions generating the given size distribution. Further, they do not disclose the effects of processes of producing slurries having different properties or of conditions of slurries depending on the processes to CMP.

SUMMARY OF THE INVENTION

Accordingly, the present invention has been made keeping in mind the above problems occurring in the prior art, and an object of the present invention is to provide a polishing slurry having high performance, a method of producing the same, and a method of polishing a substrate. In the present invention, a method and a device for pre-treating various particles, a dispersing device and a method of operating the dispersing device, a method of adding a chemical additive and an amount added, and a device for transferring samples are properly employed to produce the polishing slurry essential to CMP for a process of producing ultra highly integrated semiconductors of 0.13 µm or less, particularly, a STI process.

Another object of the present invention is to provide a slurry having an optimum polishing particle size, in which the polishing particle size is controlled and which is useful to produce semiconductors having fine design rules, by changing the production conditions of the slurry. Furthermore, the present invention provides a polishing slurry and a method of producing the same, in which a desirable CMP removal rate is assured and scratches are suppressed, by controlling a polishing particle size distribution.

Still another object of the present invention is to provide a method of effectively polishing a semiconductor substrate having a fine design rule using the above slurry. In order to accomplish the above objects, the present invention provides a polishing slurry comprising polishing particles, which have a particle size distribution including separated fine and large polishing particle peaks. The polishing particles include secondary particles having a median size of 50-450 mm, the secondary particles include primary particles having a median size of 50-300 nm, and the primary particles include grains having a median size of 50-150 nm.

An area ratio of the fine polishing particle peak to the large polishing particle peak may be 1-25, and more preferably, the area ratio of the fine polishing particle peak to the large polishing particle peak may be 3-16.

Meanwhile, the present invention may provide a polishing slurry comprising polishing particles, which have a median size of 50-150 nm. The polishing particles may include primary particles having a median size of 10-120 mm, and the primary particles may include grains having a median size of 10-100 nm.

The polishing particles are ceria, and the polishing slurry may further comprise deionized water and an anioinic polymer compound. The anionic polymer compound may be selected from the group consisting of polymethacrylic acid, ammonium polymethacrylate, polycarboxylate, sodium dodecylsulfate, alkylbenzenesulfonate, alpha-olefinsulfonate, sodium salt of monoalkyl phosphate or fatty acid, carboxyl-acryl polymer, and any combination thereof. The polishing slurry comprises 0.0001-10 wt % anionic polymer compound, and the anionic polymer compound may include a polymer having a molecular weight of 2,000-50,000 g/mol. The polishing slurry may further comprise a weak acid, organic acid, or weak base.

Furthermore, the present invention provides a method of producing a polishing slurry. The method comprises a step of preparing polishing particles which have a particle size distribution including separated fine and large polishing particle peaks.

Additionally, the present invention provides a method of producing a polishing slurry. The method comprises a step of preparing polishing particles which have a median size of 50-150 nm.

The method may further comprise steps of mixing the polishing particles with deionized water and milling them, stabilizing dispersion by adding a dispersing agent and an additive to the milled mixture slurry, and controlling a weight of the resulting mixture slurry and removing large particles by filtering.

The polishing particles may be produced through a solid-phase synthesis process in the step of preparing the polishing particles.

The step of preparing the polishing particles may comprise the step of controlling a calcination temperature to control a particle size and the particle size distribution of the polishing particles. The calcination temperature may be 400-1,300°, and more preferably, the calcination temperature may be 700-900°.

The step of milling the mixture may comprise the step of controlling the number of the milling to control a particle size and a particle size distribution of the polishing particles. The method may further comprise a step of aging the slurry to stabilize it after the filtering is conducted. A solid load of the polishing particles may be 5-40 wt % in the step of milling the mixture, and the dispersing agent may comprise an anionic polymer compound. A weak acid, organic acid, or weak base may be used as the additive to control a pH and to stabilize the slurry in the step of stabilizing the dispersion.

Furthermore, the present invention provides a method of polishing a substrate using the above polishing slurry. A silicon oxide film may be formed on the substrate.

BRIEF DESCRIPTION OF THE DRAWINGS

The above and other objects, features and advantages of the present invention will be more clearly understood from the following detailed description taken in conjunction with the accompanying drawings, in which:

FIG. 2 is a flow chart illustrating the production of polishing slurry;

DESCRIPTION OF THE PREFERRED EMBODIMENTS

Figure 1A:
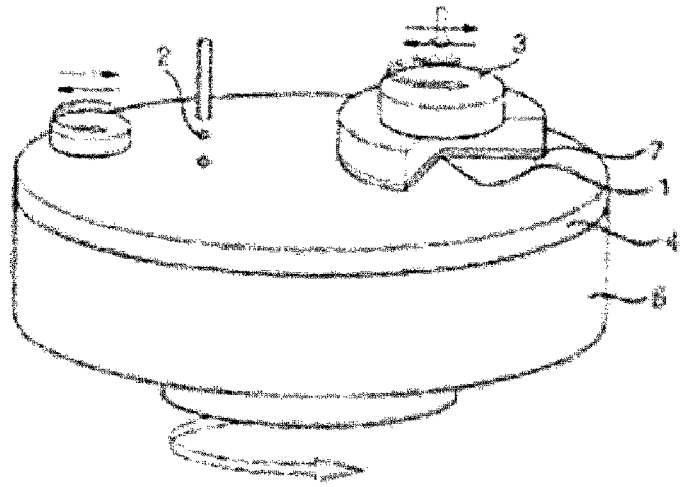
FIGS. 1a and 1b are a schematic perspective view and a schematic sectional view of a CMP device, respectively.
Figure 1B:
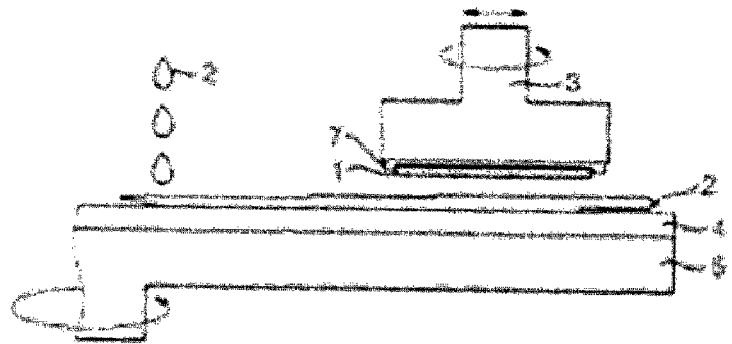
Figure 1C:
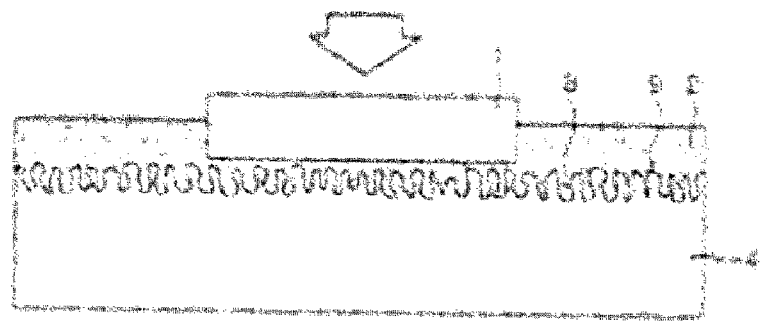
FIG. 1c is a schematic sectional view illustrating a CMP process.

Hereinafter, a process of producing a polishing slurry according to the present invention and a characteristic analysis of the polishing slurry will be separately described in detail. Furthermore, a description will be given of a method of producing the polishing slurry using ceria as a polishing agent, deionized water as a dispersion medium thereof, and an anionic polymer dispersing agent as a dispersing agent. Additionally, a description will be given of the CMP results, such as an oxide film polishing speed and selectivity, depending on process conditions. Many modifications and variations of the present invention, which will be described later, are possible, and the scope of the present invention is not limited by the following description.

According to an aspect of the present invention, a ceria slurry includes ceria powder, deionized (DI) water, an anionic polymer dispersing agent, and an additive, such as weak acid or weak base. Referring to FIG. 2, a method of producing the polishing ceria slurry is as follows.

A precursor, such as cerium carbonate, is pre-treated, that is, synthesized in a solid phase to prepare ceria powder (S1), the ceria powder is mixed and wetted with deionized water in a tank for mixing (S2), and the resulting mixture is milled using a milling machine so as to decrease the particle size and achieve distribution (S3). The anionic polymer dispersing agent is added to the slurry, which is produced according to the above procedure, to increase dispersion stability. The additive, such as a weak acid or weak base, is mixed with the mixture in a high speed mixer to control the pH, and additional milling is conducted to stabilize the dispersion (S4). Subsequently, a weight ratio (wt %) of the slurry, that is, a solid load, is desirably set (S5), and large particles are removed through filtering to prevent the precipitation and the occurrence of scratches during the CMP process (S6). Finally, additional aging is conducted, thereby stabilizing the slurry (S7).

The production of the ceria slurry for CMP will be described in detail in "a method of producing a ceria slurry."

With respect to the polishing slurry of the present invention, the ceria slurry and the chemical additive are produced separately so that the removal rate of the oxide film is controlled and it has high selectivity to the oxide film and the nitride film. The production of the chemical additive is disclosed in Korean Patent Application No. 10-2003-0030880.

[Method of Producing Ceria Slurry]

1. Production of Ceria Powder

A first stage of the production of the ceria slurry according to the present invention is to produce the ceria powder from a crude precursor through a solid-phase synthesis method. The precursor, such as cerium carbonate, is calcined to generate the ceria powder, and a separate drying process may be conducted to remove moisture before the calcination. The dried precursor is excellent in terms of transferring and processibility.

Properties of the ceria powder depend on the calcination conditions of cerium carbonate and the construction of a calcination device. Cerium carbonate has water of crystallization and adsorbed water, and water of crystallization typically has a valence of 4, 5, or 6. The calcination conditions depend on the number of water of crystallization and the amount of adsorbed water. After the calcination, water of crystallization and adsorbed water are removed. Thereafter, temperature and heat treatment are increased to cause decarbonation, in which a carbonate functional group is removed in the form of carbon dioxide. Thereby, the ceria powder starts to be generated. Next, additional heat treatment is implemented to cause recrystalization, thereby creating the ceria powder which consists of various sizes of particles. Water of crystallization and adsorbed water are removed at room temperature to 250°, the decarbonation is conducted at 230° or more, and crystals start to be formed at 330° or more. Crystallization is achieved at a calcination temperature of 400-1,300°, and preferably, 700-900°.

Cohesion of the particles after calcination depends on the amount of adsorbed water and water of crystallization, and when the amount is great and they are insufficiently removed from a heating furnace, the cohesion increases.

Figure 3A:
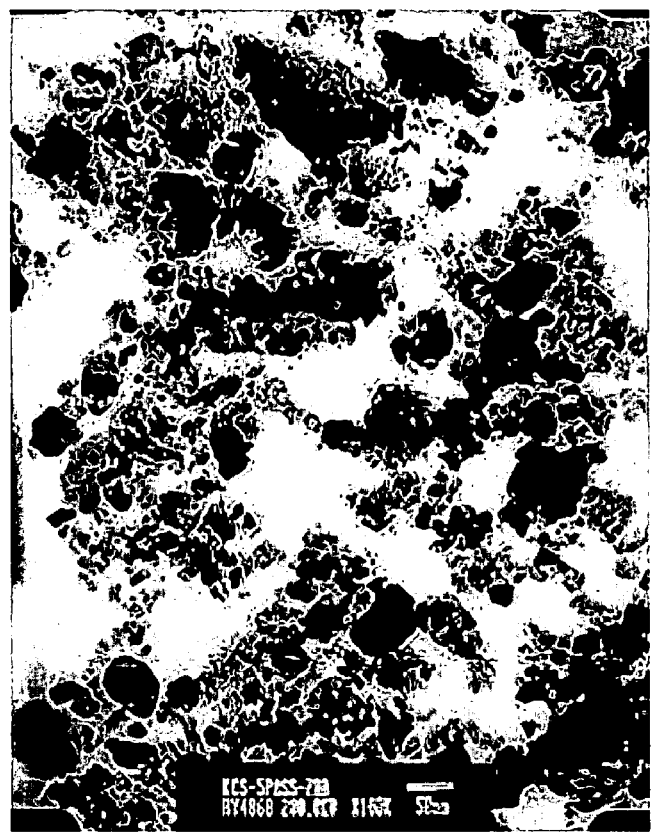
FIGS. 3a and 3b are a TEM picture and a SEM picture of polishing slurry calcined at 700°, respectively.
Figure 3B:
Figure 4A:
FIGS. 4a and 4b are a TEM picture and a SEM picture of polishing slurry calcined at 800°, respectively.
Figure 4B:
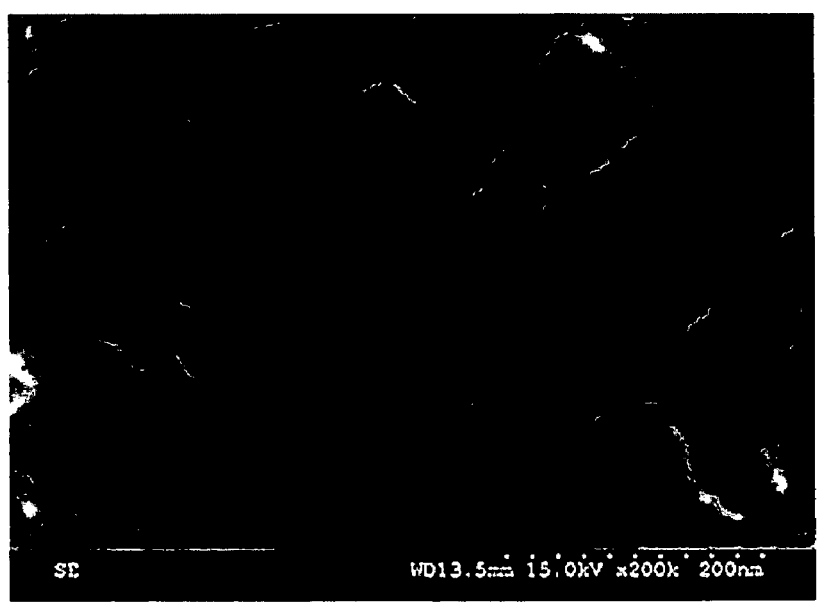
Figure 5A:
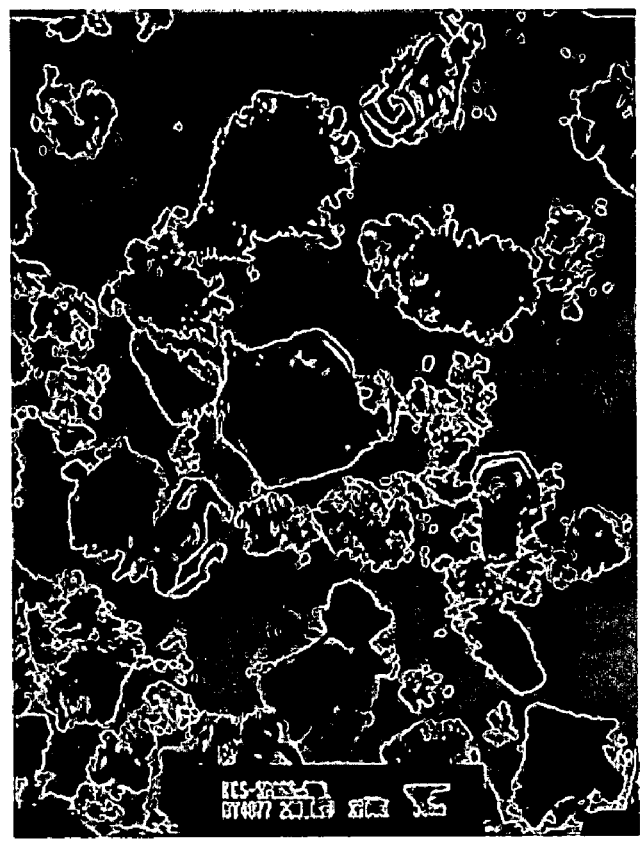
FIGS. 5a and 5b are a TEM picture and a SEM picture of polishing slurry calcined at 900°, respectively.
Figure 5B:

Furthermore, the crystallization degree and grain size depend on the crystallization temperature, and when the temperature of calcination for crystallization increases, the size of grain or crystallite increases. For example, FIGS. 3 to 5 illustrate TEM and SEM pictures of the polishing slurries produced at various calcination temperatures, which show crystallites formed at calcination temperatures of 700°, 800°, and 900°. By comparing them, it can be seen that when calcination is conducted at high temperatures, an average crystallite size increases, sizes of crystallites constituting the primary particles increase, and the number of crystallites constituting the primary particle is reduced. On the other hand, when the calcination is conducted at relatively low temperatures, the average crystallite size is decreased, the sizes of crystallites constituting the primary particles are decreased, and the number of crystallites constituting the primary particle is increased.

A detailed description will be given of the calcination process and the calcination device, below. Cerium carbonate $(Ce_2(CO_3)_3 \cdot 6H_2O)$ is fed into a container or a saggar which contains 34.1% aluminum oxide $(Al_2O_3)$, 61.9% silicon dioxide $(SiO_2)$, 1.23% lithium oxide $(LiO_2)$, and 2.77% balance. Additionally, gas, such as nitrogen or fresh dried air, is supplied to effectively remove $CO_2$ gas generated as a byproduct during the calcination. The gas is sufficiently supplied and the calcination is conducted at 400-1,300°, thereby producing light yellow powder, that is, cerium oxide, without a floating component.

2. Mixing and Milling

The ceria powder, which is produced through the calcination process as described above, is mixed and wetted using deionized water and a high speed mixer. The mixture is milled using a high energy milling machine to reduce a particle size and disperse particles, thereby producing a nano-sized ceria slurry. Since the ceria slurry has many pores, mixing must be conducted for 10 min or more to achieve sufficient wetting. Preferably, premixing is conducted for one hour or more. An agitator of the mixer and an inside of a tank may be coated or lined with Teflon to prevent metal contamination.

The slurry is mixed with deionized water or purified water so that the concentration of polishing particles, that is, the solid load, is within a desired range, for example, 5 to 40 wt %. The higher the solid load is, the higher the productivity is. However, if the solid load is maintained at a very high level, since the viscosity of the slurry is very high and cohesion frequently occurs, the milling efficiency is drastically reduced during the subsequent milling process or the milling process may be mechanically impossible. Hence, it is preferable to maintain the desirable solid load.

After the above mixing, size reduction and distribution are conducted using a high energy milling machine so as to control the particle size and to distribute the cohering particles. The milling machine may be exemplified by a wet or dry milling machine. Since the dry milling machine may be contaminated by metal pieces caused by the abrasion of metal portions during the milling process, it is preferable to conduct the milling process using a wet milling machine made of ceramic. Meanwhile, when using a wet milling process, precipitation caused from the cohesion of the particles and reduction of milling efficiency may occur, and the presence of large particles and a size distribution having a large area may be likely to occur. Thus it is necessary to control the concentration of the polishing particles, to control a pH and conductivity, and to increase dispersion stability using a dispersing agent.

In the wet milling process using the ceria slurry, the milling process is conducted in such a way that beads having a size of 0.05-1.0 mm are packed in a volume of 20-80 vol % and a rotation speed per min of the high energy milling machine is controlled to 500-2,500 rpm, thereby producing the slurry having a desirable average secondary particle size distribution.

The particle size and the particle size distribution, which are obtained after the milling process is conducted, are closely connected to the removal rate of CMP, the incidence of scratches, dispersion stability of the slurry, and precipitation, as will be described in detail in "Property analysis of a ceria slurry."

3. Dispersion Stability and Addition of Additive

An anionic polymer dispersing agent is added to the slurry, and the additive, such as weak acid or weak base, is added thereto to control a pH, thereby stabilizing the slurry.

Figure 7:
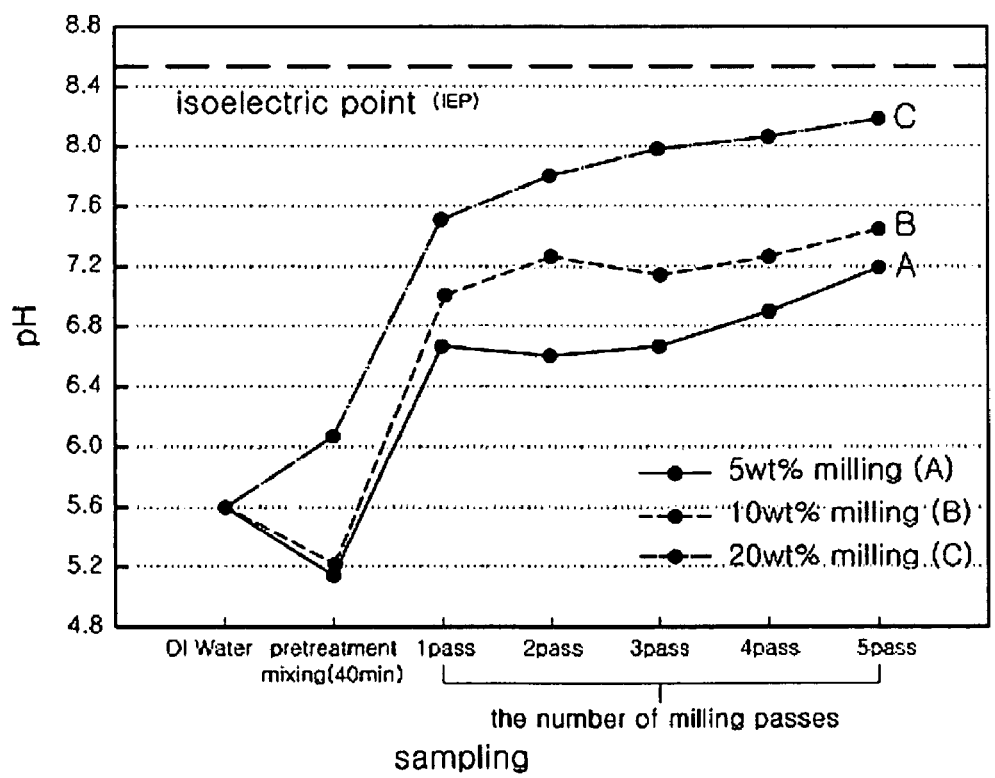
FIG. 7 is a graph showing the pH of polishing slurry as a function of the milling number.

FIG. 7 shows that the pH of the slurry approaches an isoelectric point (IEP), at which an electrokinetic sonic amplitude (ESA) becomes 0, in accordance with the repetition of the milling process. When the pH of the slurry approaches the point at which the electrokinetic sonic amplitude becomes 0, electric repulsive forces between the particles are reduced, which means that the possibility of cohesion of the particles increases. In other words, a zeta potential value is 0, causing the cohesion of the slurry. Particularly, if the solid load is 20 wt % or more, since the pH more rapidly approaches the IEP according to the repetition of the milling process in comparison with the milling process using the low solid load, cohesion occurs more frequently. Accordingly, in order to assure dispersion stability before the milling process and to prevent re-cohesion after the milling process, the milling process may be conducted after the pH of the slurry is controlled to deviate from the IEP and to correspond to acid such that dispersion stability is improved, or the milling process may be conducted after the polymer dispersing agent is added to improve dispersion stability.

With respect to this, the anionic polymer dispersing agent may be any one selected from the group consisting of polymethacrylic acid, ammonium polymethacrylate, polycarboxylate, sodium dodecylsulfate, alkylbenzenesulfonate, alpha-olefinsulfonate, sodium salts of monoalkyl phosphate fatty acid, carboxyl-acryl polymer, and a combination thereof.

After the dispersing agent is added, dispersion stability of the slurry is improved. The repulsive forces between the particles are increased in accordance with an increase in an absolute value of the electrokinetic sonic amplitude, so that precipitation of the slurry due to cohesion is prevented and stable dispersion is achieved. The mixing and dispersion are conducted for 10 min-24 hours. It is preferable to conduct the mixing and dispersion for 30 min or more in consideration of adsorption of polymer and stabilization of the pH, and to conduct the mixing and dispersion for 2 hours or more in consideration of aging.

Since the slurry of the present invention is water-soluble, solubility of a polymer compound in water at room temperature is desirable as a basic property. The amount of the anionic polymer compound is 0.0001-10.0 wt, preferably, 0.001-3.0 wt %, and more preferably, 0.02-2.0 wt % based on the weight of the polishing particles.

Meanwhile, if the dispersing agent to be added to the slurry contains cationic substances or cations contained in additives or the like are added to the slurry, the cationic substances are bonded to the anionic polymer dispersing agent, thereby reducing the absolute value of the electrokinetic sonic amplitude. This may cause re-cohesion between the particles in the dispersed slurry. Furthermore, since the charge density depends on the molecular weight, it is necessary to select the dispersing agent which has a high charge density and a proper molecular weight causing no re-cohesion. For example, it is preferable to use the anionic polymer dispersing agent having a molecular weight of 3,500-15,000 (g/mol). If the molecular weight of the dispersing agent is 50,000 (g/mol) or more, the re-cohesion between the particles is caused by a bridging phenomenon, thereby promoting the generation of large particles. Accordingly, it is preferable to use a dispersing agent having the molecular weight from 2,000-50,000 (g/mol).

Additionally, a pH controlling agent may be any one selected from the group consisting of a weak base or weak acid, such as ammonium hydroxide, tetra-methyl ammonium hydroxide, mono-ethanol amine, tri-ethanol amine, benzoic acid, lactic acid, acetic acid, hydrocyanic acid, or propionic acid, organic acid, such as polymethacrylic acid or polyacrylic acid, and a combination thereof.

It is preferable that the viscosity behavior of the stabilized ceria slurry be a Newtonian behavior. In other words, before dispersion is stabilized, viscosity of the slurry depends on the shear rate. On the other hand, after dispersion is stabilized, viscosity of the slurry shows Newtonian behavior, which is independent of the shear rate.

4. Control of Solid Load (wt %) and Removal of Large Particles

After a dispersion stabilization process of the slurry is completed, the solid load (wt %) of the ceria slurry is controlled to a desired range and the large particles are removed by filtering, thereby controlling a particle size distribution of the polishing particles in the slurry. When a great volume of the large particles exists, the gravitational force is larger than the dispersion force caused by the repulsive force between the particles, and surface areas of the large particles are smaller than those of the fine particles. Thus, dispersibility of the large particles is less than that of the fine particles. For the above two reasons, cohesion and precipitation frequently occur, making the slurry unstable. Therefore, it is necessary to remove the large particles to control the particle size distribution. As the number of filtering for removing the large particles, the large particles can be reduced.

5. Aging of Slurry

Stabilization of the slurry by aging is achieved by stirring the slurry in a tank for 24 hours so as to still further stabilize the slurry. This may be additionally conducted using the completed slurry, and may be omitted if necessary.

[Property Analysis of Ceria Slurry]

Properties of the ceria slurry, which is produced through the procedure as described above, are analyzed, and the results will be described. Hereinafter, a description will be given of the particle size and the particle size distribution, which is directly connected to the basic performance of the slurry, such as the removal rate of CMP and the number of scratches generated during the polishing process, and to the dispersion stability of the slurry.

Precise analysis of properties, such as the particle size, which includes a grain size, a primary particle size, and a secondary particle size, and the particle size distribution of the polishing particles, is very important to minimize the scratches caused by the large particles and to maintain the high removal rate for high yield in a process of producing semiconductors.

The grain size, the primary particle size, and the secondary particle size of the ceria slurry according to the present invention may be controlled according to the production conditions of the slurry, and it is possible to produce the slurries, which satisfy each condition required in the design rule of a semiconductor device, by the above control. In other words, crystallization and grain size depend on calcination conditions. For example, as a calcination temperature, at which crystallization is conducted, is higher, grain size or crystallite size is larger. Furthermore, since the particle size distribution of the final ceria particles depends on milling conditions as well as the calcination temperature, it is possible to control the particle size and the particle size distribution of the ceria particles by adjusting the calcination and milling conditions.

If it is required to reduce the design rule and thus reduce permitted limits to the number and the sizes of the scratches, it is necessary to use the still smaller primary and secondary particles. With respect to the control of the size, it is possible to control the grain size by adjusting the calcination temperature, and to control the primary particle size and the secondary particle size by adjusting the milling conditions. As well, the sizes of the secondary particles, which exist in an aqueous solution in which the primary particles cohere or are dispersed, are increased according to increases in the sizes of the primary particles and in the cohesion. Since the sizes of the secondary particles depend on the dispersion degree as well as the milling conditions, the sizes of the secondary particles are controlled by adjusting dispersibility in conjunction with the milling conditions.

It is preferable that the polishing particles in the slurry be neither very small nor very large, but have a predetermined size. As for the particle sizes of the polishing particles of the ceria slurry produced according to the present invention, the polishing particles include the secondary particles having a median size of 50-450 nm, the secondary polishing particles include the primary particles having a median size of 50-300 nm, and the primary particles include grains having a median size of 50-150 nm. Meanwhile, the present invention provides a polishing slurry containing polishing particles, in which the polishing particles include the secondary particles having a median size of 50-150 nm. In this regard, the polishing particles include the primary particles having a median size of 10-120 nm, and the primary particles include grains having a median size of 10-100 nm. Distributions of the above particles are connected to each other, and, if the size of one type is changed, the sizes of the other two types are influenced. For example, if the grain size is changed, the primary particle size and the secondary particle size are changed.

Figure 6:
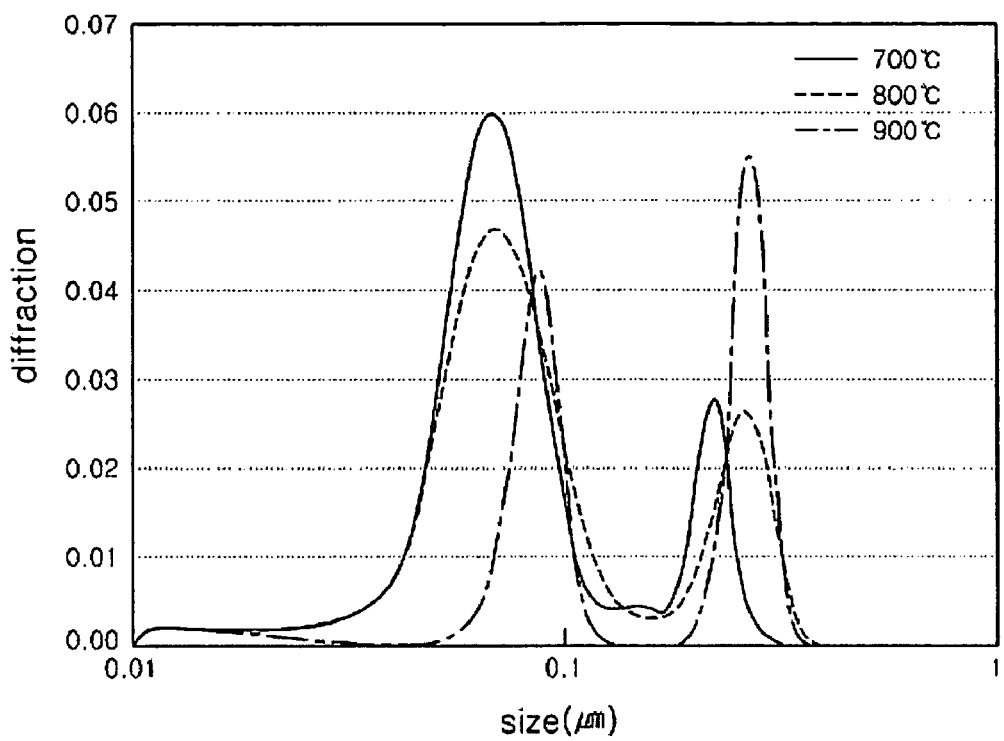
FIG. 6 is a graph showing particle size distributions depending on the calcination temperature.

Meanwhile, the shape of the particle size distribution is also important in conjunction with the particle size. In the present invention, it is possible to control the particle size distribution of the final ceria particles to be shaped in bimodal peaks consisting of a fine particle region and a large particle region. Referring to FIG. 6 which shows the results measured using APS, the horizontal axis denotes the size of the secondary particles, and the vertical axis denotes diffraction which means the proportion of slurry particles, having the same size, to the total number of slurry particles. The ceria polishing particles show the particle size distribution having two peaks consisting of the fine particle region and the large particle region. As the calcination temperature is higher, the bimodal peaks are converted into two sharp peaks.

The crystallite size, the number of crystallites constituting one particle, and the particle size distribution expressed by the bimodal peaks, significantly influences the results of CMP. The effects will be described with regards to the removal rate and micro-scratches.

First, the effect of the particle size distribution to the removal rate will be described based on the mechanism of CMP. For example, within a range from the calcination temperature of 400-1,300° to a predetermined temperature, since the grain size increases according to an increase in the calcination temperature, the removal rate increases. However, if the calcination temperature is the predetermined temperature or more, the removal rate is reduced even though the distribution of large grains in the slurry is increased.

The above fact may be explained as follows. Two main variables that influence the removal rate in the CMP process, are the grain size and surface areas of new surfaces of ceria particles generated during the CMP process. CMP is conducted so that the slurry acting as a polishing agent and a chemical substance acting as an additive are mixed with each other in a predetermined ratio, thereby assuring high selectivity. Polymer contained in the additive is adsorbed onto the surface of a wafer. Since polymer has an electric charge, it is adsorbed onto the nitride film rather than onto the oxide film (which is to be etched). However, since polymer has a large molecular weight, it is partially adsorbed onto the oxide film due to its intrinsic properties. Polymer adsorbed onto the surface of the oxide film forms viscous layers on the wafer, and thus reduces the removal rate of the oxide film. Accordingly, if the grain size is smaller than the thickness of the viscous layer, the removal rate of the oxide film is significantly reduced. If the grain size is larger than the thickness of the viscous layer, the removal rate is increased.

However, the removal rate is not continuously increased according to an increase in the grain size. If the grain size is larger than the thickness of the viscous layer, the removal rate is increased to the predetermined extent and then reduced. This is caused by the second variable influencing the removal rate. In other words, the second variable is caused by formation of the new surface. CMP is achieved by a chemical factor as well as a mechanical factor. Chemical bonds are formed between the surface of ceria and the surface of the oxide film through a chemical reaction, and ceria particles attached to the oxide film are pushed using a pad, thereby removing the oxide film. At this time, since ceria is poly-crystal, it is broken into single crystals during CMP. At this time, the new surfaces generated during CMP are more active and chemical than the old surfaces of the ceria particles. Accordingly, as more new surfaces are generated, the removal rate increases.

However, if the calcination temperature is still higher than the predetermined temperature and thus the grain size is excessively increased, the new surfaces are generated in a relatively small volume when the poly-crystal is broken into single crystals, in comparison with the slurry having a small grain size. Hence, the removal rate is reduced and the number of scratches is increased. On the other hand, if the calcination temperature is very low and thus the distribution of fine particles is increased, since the slurry mostly consists of the fine particles, the removal rate is reduced.

Meanwhile, another main variable in CMP is the number of micro-scratches, which are formed on an object surface to be etched, due to the polishing particles. When the primary particle size is large, or sizes of crystallite particles formed by breaking the primary particles using the pressure of the pad during the CMP process are large, the number of scratches increases. Accordingly, if the calcination temperature is the predetermined temperature or higher, the number of scratches is increased.

Therefore, it is very important to control the particle size or the particle size distribution of the polishing particles of the slurry in order to produce slurry having improved properties so as to increase the removal rate and to reduce the number of scratches.

Hereinafter, a detailed description will be given of the particle sizes and the particle size distributions of the polishing particles of the slurries which are produced under variable production conditions.

Figure 8:
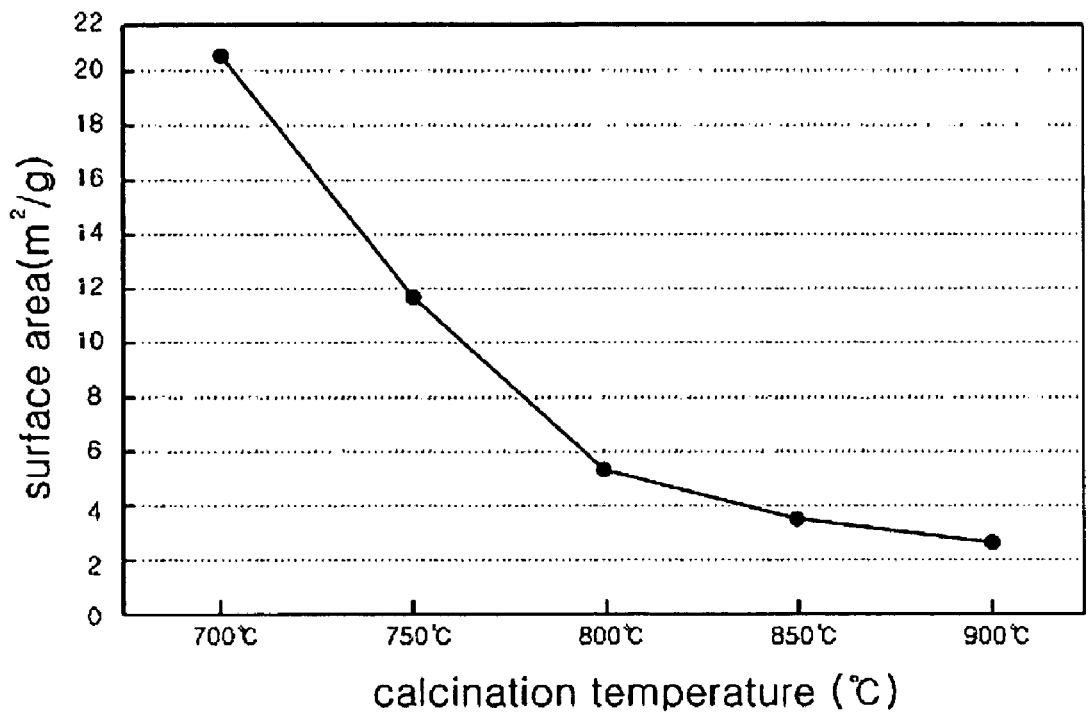
FIG. 8 is a graph showing the surface area per unit gram as a function of the calcination temperature.

The difference between the grains according to the calcination temperature will be described, with reference to FIGS. 3 to 5. FIGS. 3 to 5 are pictures of the grains and the primary particles of the ceria slurries which are calcined at 700°, 800°, and 900°, which show that the grain size is increased according to an increase in the calcination temperature. Accordingly, in the ceria slurries calcined at the above temperatures, the number of grains constituting one primary particle is reduced as the calcination temperature is increased, and thus the surface areas of the ceria particles, which are generated in the course of conducting CMP, are reduced. The average grain size and the surface areas obtained from FIGS. 3 to 5 are described in the following Table 1. From Table 1, it can be seen that the surface area is reduced as the calcination temperature is increased like in FIG. 8 which is a graph showing the surface area per unit gram as a function of the calcination temperature.

TABLE 1

| Calcination temperature | Grain size | Surface area (m$^2$/g) |
|---|---|---|
| 700° | 24.1 | 20.8453 |
| 800° | 47.7 | 5.4213 |
| 900° | 77.2 | 2.6435 |

Meanwhile, the shape of the particle size distribution as well as the particle size is the important factor. As described above, the ceria slurry produced according to the present invention shows the particle size distribution which has two peaks consisting of the fine particle region and the large particle region. In this regard, the large particles corresponding to the second peak mainly cause the scratches.

First, a description will be given of the shapes of the particle size distributions according to the calcination temperature. As shown in FIG. 6, when the calcination temperature increases, the shape of the particle size distribution is a bimodal-type which includes two sharp peaks, and the proportion of the large particles is relatively high. On the other hand, when the calcination temperature is reduced, since both the fine particle peak and the large particle peak are widened a little, the particle size distribution has smooth peaks and the proportion of fine particles is relatively increased.

Therefore, a method of reducing the peak corresponding to the large particle region which causes the scratches is to conduct the calcination at low temperatures. However, if the calcination temperature is excessively reduced in order to reduce the large particle peak and to enlarge the fine particle peak, since the grain size is reduced, the removal rate is reduced when an object material (for example, oxide film) is polished. In other words, if the grain size of the polishing particle is excessively small, since the grains do not permeate through the viscous layer which is formed by the additive on the surface of the oxide film during the CMP process, the removal rate is reduced.

Hence, a change of the milling conditions as well as the reduction of the calcination temperature enlarges the fine particle peak and reduces the large particle peak while the grain size of the polishing particle is maintained at a predetermined value. The entire large particle peak may be shifted into the fine particle region by changing the milling conditions. Furthermore, if the large particles are broken by milling to reduce the size of the particle, since the large particles are broken into many fine particles, the large particle peak is rapidly reduced and the fine particle peak is enlarged in the particle size distribution. When the fine particle peak is increased as described above, the removal rate remains high because the grain size depending on the calcination temperature is controlled even though the median size of the secondary particles is small.

Meanwhile, it is noted that the slurries having the different particle size distributions have the same median size as the particles in FIG. 6. In other words, even though the slurries have the same median size, if the calcination conditions and the milling conditions are changed, the particle size distribution, particularly, proportions of the large particle peak and the fine particle peak, are changed.

The number of grains constituting the primary particle must be large so that the primary particle size or the grain size is larger than the thickness of the viscous layer formed on an upper side of an object film to be polished through two mechanisms of CMP as described above, and so that the chemical reaction between the ceria particles and the object film to be polished is conducted rapidly through the smooth formation of the new surfaces. In addition, the primary particle size and the grain size must not be excessively large, so as to prevent the occurrence of the micro-scratches.

Therefore, it is important that a combination ratio of the fine particles and the large particles be optimized so as to minimize the occurrence of the micro-scratches and to maximize the removal rate even though the average sizes or the median sizes are the same as each other. This may be realized by the ratio of a fine particle peak area to a large particle peak area in the particle size distribution. In other words, the ratio of two peak areas is calculated by dividing the fine particle peak area by the large particle peak area, and the ratio may be used as an index of the combination of the fine particle peak and the large particle peak (ratio=fine particle peak area/large particle peak area). The peak area ratios of the fine particle peak to the large particle peak, which depend on the calcination temperature, of the slurries are compared to each other in the following Table 2.

TABLE 2

| Calcination temperature | Peak area ratio |
|---|---|
| 700° | 8.25 |
| 750° | 6.01 |
| 800° | 4.56 |
| 850° | 2.85 |
| 900° | 1.09 |

The large particle peak is enlarged and the number of the scratches is increased as the peak area ratio of the fine particle peak to the large particle peak is reduced. However, the removal rate starts to be reduced when the slurry is calcined at 850°, and the removal rate of the slurry calcined at 900° is lower than that of the slurry calcined at 850°. Accordingly, it is necessary to optimize the peak area ratio in consideration of the removal rate and the scratches depending on the design rule of a semiconductor device.

Figure 9:
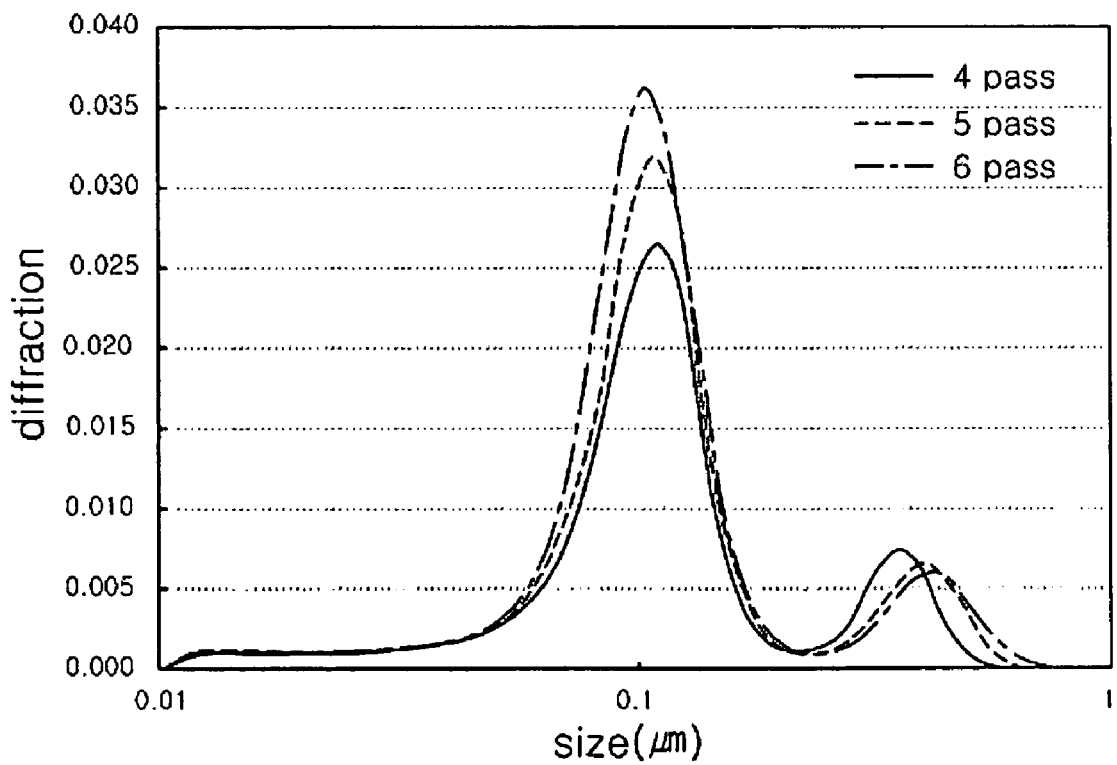
FIG. 9 is a graph showing particle size distributions depending on the milling number.

Meanwhile, in addition to the calcination conditions, the milling conditions significantly influence the removal rate and the scratches. The primary particle size is determined by the milling conditions. The primary particle size is reduced and the cohering particles are re-dispersed as the milling process is repeated under the given same calcination conditions, thereby the average particle size of the slurry is reduced. Particularly, as shown in FIG. 9, since the large particle peak is reduced and the fine particle peak is enlarged as the milling process is repeated, the peak area ratio is increased.

Therefore, since the primary particle size or the grain size must be larger than the thickness of the viscous layer formed on the upper side of the object film to be polished as described above, the removal rate is reduced as the milling process is repeated under the given same calcination conditions. However, since the large primary particles are broken into the small primary particles through the milling process, the number of the micro-scratches is reduced. The peak area ratios, which depend on the milling conditions, are described in the following Table 3.

TABLE 3

| No. of milling | Peak area ratio |
|---|---|
| 4 pass | 4.81 |
| 5 pass | 5.79 |
| 6 pass | 6.32 |

As described above, in the present invention, it is possible to enlarge the fine particle peak and to reduce the large particle peak while the grain size is maintained at a predetermined value by changing production conditions, such as the calcination conditions and the milling conditions, of the slurry. The peak area ratio of the fine particle peak to the large particle peak of the slurry produced according to the present invention is set to 1-25. With respect to this, the peak area ratio of the fine particle peak to the large particle peak may be controlled to 3-16 by adjusting the calcination conditions and the milling conditions. The peak area ratios of the fine particle peak to the large particle peak of the slurries, which include the polishing particles having the different median sizes, may be controlled as shown in the following Table 4.

TABLE 4

| Median size | Mode of large particle peak | Mode of fine particle peak | Peak area ratio |
|---|---|---|---|
| 250 nm | 279 nm | 84 nm | 7.85 |
| 104 nm | 222 nm | 58 nm | 8.68 |
| 75 nm | 176 nm | 36 nm | 15.22 |

The mode of the peak is the size of particle corresponding to the maximum value of the peak. The removal rate, removal uniformity, and the number of micro-scratches of the slurry which includes the polishing particles will be described in detail in the following examples.

In examples, the ceria powder and the slurry are produced under predetermined conditions through the method as described above, and properties of polishing powder and properties of the slurry are analyzed. Analysis equipment is as follows:

1) Particle size distribution: measured using APS manufactured by Matec Applied Science Co. in the USA 2) Electrokinetic sonic amplitude (dispersion stability): measured using ESA 9800 manufactured by Matec Applied Science Co. in the USA 3) Viscosity: measured using a Brookfield viscometer, DVII+

4) The number of large particles: measured using Accusizer 780FX manufactured by PSS Inc. in the USA 5) pH: measured using a pH meter manufactured by Orion, Inc. in the USA 6) Conductivity: measured using a conductivity meter manufactured by Orion, Inc. in the USA EXAMPLES 1 to 5

Dependence on Calcination Temperature (1) Preparation of Ceria Powders 1 to 5

25 kg of highly pure cerium carbonate was charged in a container by about 800 g at every temperature, and calcined in a calcination furnace for 4 hours. With respect to the calcination temperature of examples 1 to 5, the temperature increase rate and the holding temperature were as follows.

TABLE 5

|  | Temperature increase rate(°/min) | Holding temperature(°) |
|---|---|---|
| Ceria powder 1 | 3.9 | 700 |
| Ceria powder 2 | 4.2 | 750 |
| Ceria powder 3 | 4.4 | 800 |
| Ceria powder 4 | 4.7 | 850 |
| Ceria powder 5 | 5.0 | 900 |

Spontaneous cooling was conducted in such a way that gas flowed at a rate of 20 $m^3$/hr to effectively remove $CO_2$ generated as a byproduct. The calcined ceria powder was analyzed by X-ray diffraction, resulting in confirmation that highly pure cerium oxide was produced. Furthermore, the powder was analyzed using a TEM and an SEM (see FIGS. 3 to 5), it can be seen that the grain size and the primary particle size rapidly increased as the calcination temperature increased. From a BET (analyzer for specific surface area) analysis, it can be seen that the surface area per unit gram was reduced as the calcination temperature increased (see FIG. 8).

(2) Preparation of Ceria Slurries 1 to 5

Ceria slurries 1 to 5 were produced using the ceria powders 1 to 5 through the same procedure. In other words, 10 kg of synthesized highly pure ceria powder and 90 kg of deionized water were mixed with each other for 1 hour or more in a high speed mixer so as to achieve sufficient wetting, and the mixture, that is, 10 wt % slurry was subjected to a milling process. Thereby, a particle size was controlled to a desired range and cohering particles in the slurry were dispersed. Subsequently, the milled slurry, to which ammonium polymethacrylate as an anionic additive was added in an amount of 1 wt % based on the ceria powder, was mixed for 2 hours or more so as to assure sufficient adsorption, and thus dispersion was achieved. Filtering was conducted, thereby creating the ceria slurries.

(3) Comparison of Ceria Slurries 1 to 5

Viscosities were measured to evaluate dispersion stability. The results were that the viscosities were independent of the calcination temperature and the ceria slurries showed Newtonian behaviors. Therefore, it was confirmed that 1 wt % ammonium polymethacrylate sufficiently dispersed the slurries. Removal rates, the number of scratches, and removal selectivities of the ceria slurries 1 to 5 will be described in below "CMP test results."

EXAMPLES 6 to 8

Dependence on the Number of Milling Passes (1) Preparation of ceria powders 6 to 8

75 kg of highly pure cerium carbonate was charged in a container by about 800 g, and calcined in a calcination furnace at 750° for 4 hours. Spontaneous cooling was conducted in such a way that gas flowed at a rate of 20 $m^3$/hr to effectively remove $CO_2$ generated as a byproduct. The calcined ceria powder was analyzed by X-ray diffraction, resulting in confirmation that highly pure cerium oxide was produced.

(2) Preparation of ceria slurries 6 to 8

In order to produce the ceria slurry 6, 10 kg of synthesized highly pure ceria powder and 90 kg of deionized water were mixed with each other for 1 hour or more in a high speed mixer so as to achieve sufficient wetting, and the mixture, that is, 10 wt % slurry was subjected to 4 passes of a milling process. Thereby, the particle size was controlled to a desired range and cohering particles in the slurry were dispersed. Subsequently, the milled slurry, to which ammonium polymethacrylate as an anionic additive was added in an amount of 1 wt % based on the amount of the ceria powder, was mixed for 2 hours or more so as to assure sufficient adsorption, and thus dispersion was achieved. Filtering was conducted, thereby creating the ceria slurry. Ceria slurries 7 and 8 were produced through the same procedure as the ceria slurry 6 except that the ceria slurries 7 and 8 were subjected to 5 and 6 passes, respectively, of the milling process.

(3) Comparison of Ceria Slurries 6 to 8

Viscosities were measured to evaluate dispersion stability. The results were that the viscosities were independent of the calcination temperature and the ceria slurries showed Newtonian behaviors. Therefore, it was confirmed that 1 wt % ammonium polymethacrylate sufficiently dispersed the slurries. Particle size distributions of the ceria slurries 6 to 8 are shown in FIG. 9. Removal rates, the numbers of scratches, and removal selectivities of the ceria slurries 6 to 8 will be described in the below "CMP test results."

EXAMPLES 9 to 11

Dependence on the Median Size of Polishing Particles (1) Preparation of Ceria Powders 9 to 11

75 kg of highly pure cerium carbonate was charged in a container by about 800 g, and calcined in a calcination furnace at 750° for 4 hours. Spontaneous cooling was conducted in such a way that gas flowed at a rate of 20 m$^3$/hr to effectively remove $CO_2$ generated as a byproduct. The calcined ceria powder was analyzed by X-ray diffraction, resulting in confirmation that highly pure cerium oxide was produced.

(2) Preparation of Ceria Slurries 9 to 11

In order to produce the ceria slurry 9, 10 kg of highly pure ceria powder and 90 kg of deionized water were mixed with each other for 1 hour or more in a high speed mixer so as to achieve sufficient wetting, and the mixture, that is, 10 wt % slurry, was repeatedly subjected to a milling process until the median size of secondary particles was 205 nm, for example, 7 passes. Through the milling process, the particle size was controlled to a desired range and cohering particles in the slurry were dispersed. Subsequently, a polymer-based dispersing agent as an anionic additive was added in an amount of 1 wt % based on the amount of ceria powder, and mixing was conducted for 2 hours or more so as to assure sufficient adsorption, and thus dispersion was achieved. Filtering was conducted, thereby creating the ceria slurry. The ceria slurries 10 and 11 were produced through the same procedure as the ceria slurry 9 except that the ceria slurries 10 and 11 were subjected to the milling process repeatedly until the median size of the secondary particles was 110 nm, for example, 13 passes, and 75 nm, for example, 20 passes, respectively.

(3) Comparison of Ceria Slurries 9 to 11

Figure 10:
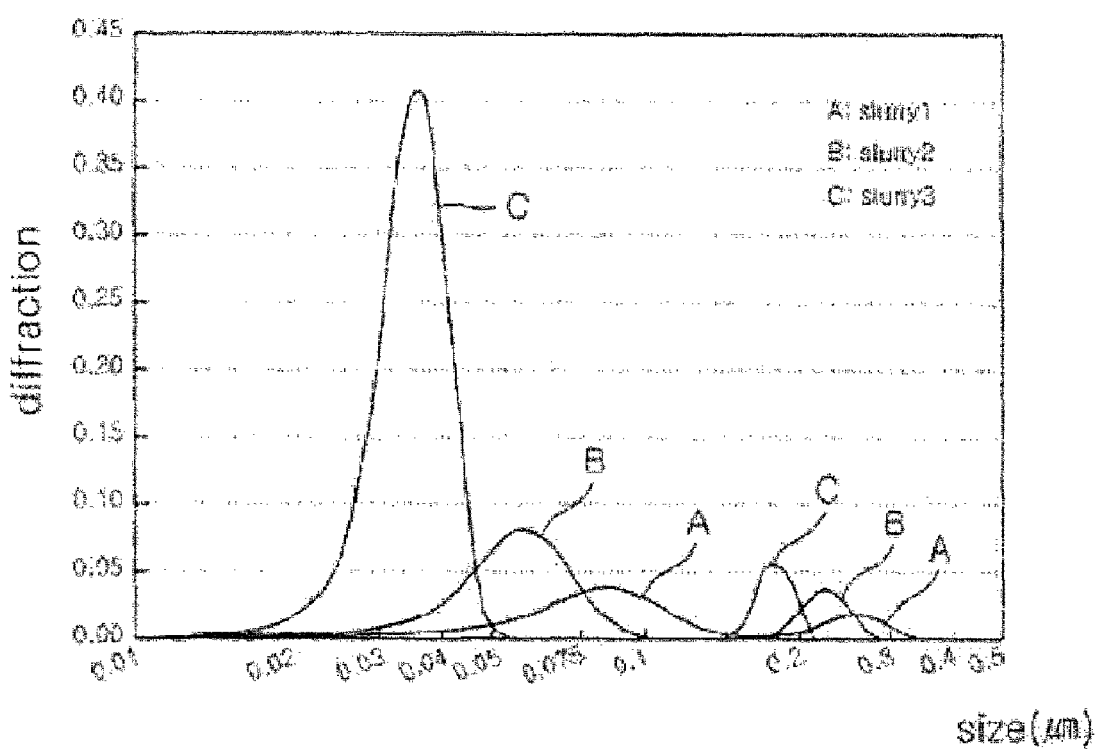
FIG. 10 is a graph showing particle size distributions depending on the median size of secondary particles.

Viscosities and electrokinetic sonic amplitudes were analyzed to evaluate dispersion stability. The results were that the ceria slurries showed Newtonian behaviors and that sufficient repulsive force between the particles was assured. Therefore, it was confirmed that 1 wt % polymer-based dispersing agent sufficiently dispersed the slurries. Particle size distributions of the ceria slurries 9 to 11 are shown in FIG. 10.

[CMP Test Results]

Polishing performance tests were carried out using polishing slurries for CMP produced according to examples 1 to 11. 6EC manufactured by Strasbaugh, Inc. in the USA was used as a CMP device. An 8" wafer, on which PE-TEOS (plasma enhanced chemical vapor deposition TEOS oxide) was applied to form an oxide film on the entire surface thereof, and another 8" wafer, on which $Si_3N_4$ was applied to form a nitride film on the entire surface thereof, were used as an object wafer. Test conditions and consumption substances were as follows:

1) Pad: IC1000/SUBAIV (purchased from Rodel, Inc. in the USA)
2) Device for measuring a film thickness: Nano-Spec 180 (purchased from Nano-metrics, Inc. in the USA)
3) Table speed: 70 rpm
4) Spindle speed: 70 rpm
5) Down force: 4 psi
6) Back pressure: 0 psi
7) Amount of slurry supplied: 100 ml/min
8) Measurement of residual particles and scratches: measured using Surfscan SP1 manufactured by KLA-Tencor, Inc. in the USA.

Surfaces of the wafers, on which the oxide film (PE-TEOS) and the nitride film (Si3N4) were formed, were polished using the polishing slurries, which were produced under the conditions given in examples 1 to 11, for 1 min. The removal rate was determined from a thickness change of the polished film, and the micro-scratches were measured using Surfscan SP1. Polishing performance for the slurries was tested in such a way that polishing characteristics were measured after a blank wafer was polished three times or more. Averages of the measured values are described in the following Table 6.

TABLE 6

| Exmpl. | Production conditions | Median size of secondary particles (nm) | Peak area ratio | Removal rate of oxide film (Å/min) | Removal rate of nitride film (Å/min) | Removal ratio of oxide to nitride | WIWNU (%) | Oxide film residual particles (#) | Scratches (#) |
|---|---|---|---|---|---|---|---|---|---|
| 1 | Calcination Temp. 700° | 300 | 8.25 | 2030 | 50 | 40.8 | 1.0 | 293 | 1 |
| 2 | Calcination Temp. 750° | 294 | 6.01 | 2179 | 51 | 42.9 | 1.1 | 355 | 3 |
| 3 | Calcination Temp. 800° | 296 | 4.56 | 2424 | 50 | 48.3 | 1.2 | 405 | 4 |
| 4 | Calcination Temp. 850° | 292 | 2.85 | 2591 | 48 | 54.2 | 1.4 | 477 | 6 |

TABLE 6-continued

| Exmpl. | Production conditions | Median size of secondary particles (nm) | Peak area ratio | Removal rate of oxide film (Å/min) | Removal rate of nitride film (Å/min) | Removal ratio of oxide to nitride | WIWNU (%) | Oxide film residual particles (#) | Scratches (#) |
|---|---|---|---|---|---|---|---|---|---|
| 5 | Calcination Temp. 900° | 298 | 1.09 | 2525 | 48 | 52.6 | 1.3 | 494 | 8 |
| 6 | 4 pass milling | 433 | 4.81 | 2417 | 49 | 49.0 | 1.3 | 428 | 6 |
| 7 | 5 pass milling | 344 | 5.79 | 2267 | 50 | 45.0 | 1.2 | 384 | 4 |
| 8 | 6 pass milling | 295 | 6.32 | 2212 | 48 | 45.7 | 1.1 | 350 | 3 |
| 9 | 7 pass milling | 250 | 7.85 | 2280 | 52 | 43.8 | 1.2 | 340 | 3 |
| 10 | 13 pass milling | 104 | 8.68 | 2090 | 48 | 43.5 | 1.0 | 200 | 2 |
| 11 | 20 pass milling | 75 | 15.22 | 1760 | 48 | 36.7 | 1.0 | 90 | 0 |

All Examples 1 to 11 are acceptable in the removal rate and removal selectivity (removal ratio of the oxide film to the nitride film), and also excellent in the within-wafer-nonuniformity (WIWNU) which indicates removal uniformity of the polished wafer during the polishing process.

When observing a CMP characteristic change according to a calcination temperature change referring to examples 1 to 5, it can be seen that since peak area ratios, that is, particle size distributions, are different from each other as the calcination temperature increases even if the median sizes of the secondary particles are the same as each other, the removal rate of the oxide film increases up to 850°. However, when the calcination is conducted at 900°, the removal rate is influenced by a small surface area rather than a increased grain size, and thus the removal rate of the oxide film is reduced. The removal rate of the nitride film is constant because the polymer-based additive is thickly adsorbed. Furthermore, since the grain size increases as the calcination temperature increases, the number of residual particles of the oxide film and the number of scratches increase.

Meanwhile, in examples 6 to 8, the median size of the secondary particles is reduced and the removal rate of the oxide film is also reduced, as milling is repeated at the given calcination temperature. Since the polymer-based additive is thickly adsorbed, the removal rate of the nitride film is constant. However, a secondary particle size is reduced as milling is repeated, and thus the numbers of the residual particles of the oxide film and scratches are reduced.

Furthermore, in examples 9 to 11, when the oxide film and the nitride film are polished using the slurries in which the median size of the polishing particles is reduced, the removal rates of the oxide film and the nitride film are reduced a little, and the number of the residual particles of the oxide film and the number of the scratches are significantly reduced. The reduction of the number of the residual particles of the oxide film and the number of the scratches is a very useful property that the polishing slurry must have in the course of producing a highly integrated semiconductor having a still smaller design rule. Additionally, when the oxide film and the nitride film are polished, since the within-wafer-nonuniformity (WIWNU), which indicates removal uniformity, is very small, an object material is uniformly polished during the polishing process.

Therefore, according to the present invention, it is possible to control a grain size or a particle size distribution of polishing particles depending on a calcination temperature and milling conditions so as to minimize the occurrence of micro-scratches. Furthermore, it is possible to control a removal rate, removal selectivity, or removal uniformity, thereby producing a slurry having excellent polishing properties.

Meanwhile, a method of polishing a substrate using the above polishing slurry is as follows.

In the method of polishing the substrate according to the present invention, a predetermined substrate is polished using the above polishing slurry. A particle size of the polishing particles and a ratio of a fine particle peak area to a large particle peak area are controlled by adjusting the calcination conditions and the milling conditions.

Preferably, a substrate, on which a film to be polished and a polishing stoppage film are formed, is prepared. The film to be polished is polished using the slurry which has a preferable particle size and a particle size distribution including separated fine and large polishing particle peaks, and by means of which a removal rate is improved and the occurrence of the micro-scratches is minimized. The film to be polished is made of an oxide-based substance, and the polishing stoppage film is made of a nitride-based substance.

In the present invention, it is possible to control a particle size or a particle size distribution of polishing particles of a slurry, thereby producing the polishing slurry having improved properties. The particle size or the particle size distribution of the polishing particles can be controlled by adjusting the calcination temperature, dispersing agent and milling conditions.

Therefore, in the particle size distribution of the slurry, it is possible to control the shape of a bimodal graph so as to assure a desirable ratio of a fine particle peak area to a large particle peak area in accordance with the use of the slurry. Furthermore, a grain size of the polishing particles is controlled to control surface areas of new surfaces and to remove large particles, thereby producing the improved slurry having an improved removal rate and causing a reduced number of scratches.

As described above, in the present invention, it is possible to produce a polishing slurry having excellent physical properties which are essential in the slurry for STI CMP. When the polishing slurry is used as the slurry for STI CMP, it can be applied to various patterns required in the course of producing ultra highly integrated semiconductors, and the excellent removal rate, removal selectivity, and within-wafer-nonuniformity (WIWNU), indicating removal uniformity, and minimized occurrence of micro-scratches can be assured.

What is claimed is:

1. A polishing slurry comprising:
polishing particles comprising:
a plurality of grains;
a plurality of primary particles formed from agglomeration of one or more of the plurality of grains; and
a plurality of secondary particles formed from agglomeration of one or more of the plurality of primary particles,
wherein the secondary particles have a median size of 50-450 nm, the primary particles have a median size of 10-300 nm and the grains have a median size of 10-150 nm, and
wherein the polishing particles have a particle size distribution including separated first and second polishing particle peaks representing a first group of polishing particles having a first median particle size and a second group of polishing particles having a second median particle size greater than the first median particle size, respectively, a ratio of an area of the first particle peak to an area of the second particle peak is 2.85 to 25.

2. The polishing slurry as set forth in claim 1, wherein an area ratio of the first polishing particle peak to the second polishing particle peak is 3-16.

3. The polishing slurry as set forth in claim 1, wherein an area ratio of the first polishing particle peak to the second polishing particle peak is 3-9.

4. The polishing slurry as set forth in claim 1, wherein the polishing particles are ceria.

5. The polishing slurry as set forth in claim 1, further comprising deionized water and an anionic polymer compound.

6. The polishing slurry as set forth in claim 5, wherein the anionic polymer compound is selected from the group consisting of polymethacrylic acid, ammonium polymethacrylate, polycarboxylate, sodium dodecylsulfate, alkylbenzenesulfonate, alpha-olefinsulfonate, sodium salt of monoalkyl phosphate or fatty acid, carboxyl-acryl polymer, and any combination thereof.

7. The polishing slurry as set forth in claim 5, wherein the polishing slurry comprises 0.0001-10 wt % anionic polymer compound.

8. The polishing slurry as set forth in claim 5, wherein the anionic polymer compound includes a polymer having a molecular weight of 2,000-50,000 g/mol.

9. The polishing slurry as set forth in claim 1, further comprising a weak acid, organic acid, or weak base.

10. The polishing slurry as set forth in claim 1, wherein the primary particles have a median size of 50-300 nm and the grains have a median size of 50-150 nm.

11. The polishing slurry as set forth in claim 1, wherein the primary particles have a median size of 10-120 nm and the grains have a median size of 10-100 nm.

* * * * *

UNITED STATES PATENT AND TRADEMARK OFFICE
CERTIFICATE OF CORRECTION

PATENT NO. : 7,470,295 B2
APPLICATION NO. : 11/078538
DATED : December 30, 2008
INVENTOR(S) : Dae Hyung Kim et al.

It is certified that error appears in the above-identified patent and that said Letters Patent is hereby corrected as shown below:

Column 3, line 32, the word "mm" should read -- nm --;
Column 3, line 43, the word "mm" should read -- nm --;
Column 3, line 47, the word "anioinic" should read -- anionic --;
Column 17, lines 23-24, the word "nonunformity" should read -- nonuniformity --.

Signed and Sealed this

Twenty-fourth Day of March, 2009

JOHN DOLL
*Acting Director of the United States Patent and Trademark Office*